(12) United States Patent
Stevenson (10) Patent No.: US 7,214,934 B2
(45) Date of Patent: May 8, 2007

(54) RADIO FREQUENCY POWER GENERATOR

(75) Inventor: Hugh Charles Stevenson, Hughesdale (AU)

(73) Assignee: Varian Australia Pty Ltd, Mulgrave, Victoria (AU)

(*) Notice: Subject to any disclaimer, the term of this patent is extended or adjusted under 35 U.S.C. 154(b) by 0 days.

(21) Appl. No.: 11/186,483

(22) Filed: Jul. 21, 2005

(65) Prior Publication Data

US 2006/0017388 A1    Jan. 26, 2006

(51) Int. Cl.
H01J 49/40 (2006.01)
H01J 59/44 (2006.01)
H01J 7/24 (2006.01)

(52) U.S. Cl. .................. 250/286; 250/300; 315/111.51

(58) Field of Classification Search .......... 315/111.41, 315/111.51, 226, 242, 243, 111.21, 111.71, 315/111.91; 118/723 I, 723 IR; 250/423 R, 250/425, 426, 287–288; 204/229.1, 230.1, 204/230.7, 272

See application file for complete search history.

(56) References Cited

U.S. PATENT DOCUMENTS

| 4,525,650 | A | * | 6/1985 | Hicks et al. ................. 315/226 |
|---|---|---|---|---|
| 4,933,605 | A | * | 6/1990 | Quazi et al. ................. 315/224 |
| 5,383,019 | A | * | 1/1995 | Farrell et al. ................. 356/316 |
| 5,477,112 | A | * | 12/1995 | Lesea ........................... 315/219 |
| 5,535,906 | A | * | 7/1996 | Drummond ................... 216/67 |
| 5,552,599 | A | * | 9/1996 | Giessmann et al. ......... 250/281 |
| 5,625,185 | A | * | 4/1997 | Laser ........................... 250/288 |
| 5,650,618 | A | * | 7/1997 | Tuszewski .................... 250/296 |
| 6,329,757 | B1 | | 12/2001 | Morrisroe et al. |
| 6,413,389 | B1 | * | 7/2002 | Shih et al. ................. 204/229.1 |
| 6,469,919 | B1 | * | 10/2002 | Bennett .................... 363/56.02 |
| 6,570,343 | B1 | * | 5/2003 | Shoji et al. ................. 315/224 |
| 2004/0263412 | A1 | * | 12/2004 | Pribyl ......................... 343/866 |

* cited by examiner

Primary Examiner—Shih-Chao Chen
Assistant Examiner—Minh Dieu A
(74) Attorney, Agent, or Firm—Bella Fishman

(57) ABSTRACT

A RF power generator for exciting inductively coupled plasma for spectrometry includes an induction coil for exciting the plasma as part of its load circuit. The load circuit also comprises a capacitor connected in parallel with the induction coil. The RF power generator is a free running oscillator having a switching circuit of two MOSFETs alternately switchable on and off via a feedback control circuit from the load circuit. RF power from the switching circuit is coupled to the load circuit via an inductor. The inductor and load circuit is resonant at a first frequency, which is lower than the operating frequency of the power generator.

15 Claims, 4 Drawing Sheets

RADIO FREQUENCY POWER GENERATOR

CROSS REFERENCE TO RELATED APPLICATION

This application claims the benefit of Australian Provisional Application No. 2004904062 filed Jul. 22, 2004.

BACKGROUND OF THE INVENTION

The present invention relates to a radio frequency (RF) electrical power generator that includes an induction coil for exciting inductively coupled plasma (ICP) for use in spectrometry.

In spectrometry, an ICP may be used as a source of ions for mass spectrometry (MS) or as a source of light for atomic optical emission spectrometry (OES). The ICP apparatus typically consists of one or more water-cooled induction coils mounted coaxially with a torch assembly through which argon gas is introduced at carefully controlled rates. RF electrical power is supplied to the induction coils. The argon does not conduct electricity and so is not heated by the RF electromagnetic field of the induction coils until the plasma is "struck", typically by a small electrical discharge created in the argon by a high voltage spark. This discharge produces enough electrons and ions to interact with the RF electromagnetic field and thereby generate sufficient heat for the process of ion and electron generation to become self-sustaining, thereby sustaining the plasma.

In spectrochemical applications the temperature of the plasma is typically in a range of 3,000 K to 10,000 K. The frequency of the varying electromagnetic field can be in the range of a few MHz to many GHz, but a particularly useful range, where it is relatively easy to excite the plasma to an appropriate temperature is between 10 MHz and 50 MHz.

The generator for supplying the RF electrical power must be capable of generating sufficient power for exciting and maintaining the plasma, typically in the region of 500 W to 3 kW. It must also be capable of handling rapid and significant changes in the load impedance, as occurs for example when plasma unexpectedly extinguishes. It must also be able to handle non-constant load impedance conditions as occurs for example between excitation and sustained generation of the plasma.

Another significant factor is the cost of RF generator in a spectrometry instrument. Spectrometry instrumentation is expensive and the field is competitive, thus there are cost constraints on componentry such as the RF generator or oscillator if a manufacturer of such instruments is to remain competitive in the market.

An object of the present invention is to provide a relatively inexpensive RF electrical power generator for exciting and sustaining inductively coupled plasma for spectrometry. This object is in part met by the provision of a RF oscillator that comprises solid state components.

SUMMARY OF THE INVENTION

According to the present invention there is provided an RF power generator for an induction coil for exciting an inductively coupled plasma for spectrometry, which comprises a switching circuit connectable across a DC supply voltage having a first and a second solid state switching devices alternately switchable on and off for supplying RF power; a load circuit comprising the induction coil and a capacitor connected in parallel with the induction coil, and an inductor connected between the switching circuit and the load circuit for coupling the RF power to the load circuit, wherein the inductor and load circuit arrangement is resonant at a first frequency, and further comprises a feedback control circuit from the load circuit to the switching circuit for switching the solid state switching devices on and off for driving an oscillation in the load circuit at a second frequency that is higher than the first frequency.

In an RF generator, according to the present invention, the feedback control circuit can have an operating time delay in the microseconds range (eg. 10–20 μs) whereas the time delay associated with significant load impedance changes (for example from unexpected extinguishment of the plasma) will typically occur much more slowly (for example in milliseconds). Thus the non-constant load impedance conditions that can occur for an RF power generator for an ICP can be handled without detriment to the generator circuit by providing a feedback response time that is many times (for example 1000 times) faster than the rate of change in the load conditions. Thus an RF power generator according to the invention allows for controlled overload behaviour by inclusion of a feedback control circuit that allows a feedback response time that is very fast compared to the rate of change of the load conditions. Different types of feedback control circuits that allow this control are possible. Examples of such circuits are described below.

Also, an RF power generator, according to the present invention, may be constructed from a relatively small number of components and can utilize a relatively inexpensive DC voltage supply source (for example, a power factor corrected boost converter that is connectable to a utility 200–240 V AC supply to provide a 400 V DC supply). An RF power generator according to the invention may also include an AC to DC converter, across which the switching circuit is connected, as a further component. Thus the invention allows for the provision of an RF power generator that is relatively inexpensive.

The solid state switching devices are preferably metal oxide semiconductor field effect transistors (MOSFETs) and the feedback control circuit is such as to apply control signals to the gates of the MOSFETs for switching them on and off. The use of MOSFETs (instead of vacuum tube based oscillators as in many prior art RF generators for ICPs) allows for the provision of a compact apparatus that has a longer life than the prior art vacuum tube based oscillators, given that MOSFETs generally have a longer life than vacuum tubes. This also contributes to the cost advantage that is realisable with the invention.

According to the invention, the output to the induction coil can be controlled by the feedback control circuit being operable to vary the switching instants of the solid state switching devices (for example, MOSFETs) or it being operable to vary the DC supply voltage, or both. Preferably the switching instants of the solid state switching devices are varied. In some embodiments, a dead time between switching of the solid state switching devices is provided, that is, a time is provided when both of the solid state switching devices are off. This is to avoid any cross-conduction between the solid state switching devices which, if it occurred, could destroy the generator. In one embodiment, the output power may be controlled by varying this dead time. In another embodiment the output power may be controlled by varying a time delay between zero crossings of the load circuit output signal and the switching instants of the solid state switching devices. In another embodiment the frequency of the drive to the solid state switching devices may be varied. Other embodiments may include a combination of any of the above-described output control methods.

The feedback control circuit includes control circuitry for realising the control method or combination of methods that may be adopted in a given embodiment and such control circuitry may be implemented using analog or digital technology.

The controlled output variable may be a current, a voltage, or a combination of these.

In one embodiment the feedback control circuit is such as to drive an oscillation in the load circuit at the second frequency of about 1 to 6% above the first (resonant) frequency. This ensures that the load on the solid state switching devices is inductive. For MOSFETs, with appropriate dead time, an inductive load allows the output capacitance of the MOSFETs to be discharged during the dead time, reducing the loss during turn-on.

For an embodiment where the DC supply voltage is provided by an AC to DC converter, the converter may be isolated or non-isolated. If non-isolated, DC blocking capacitors are included between the switching circuit and the load circuit.

In a preferred embodiment of the invention, the first and second solid state switching devices are in a modified half bridge configuration wherein each solid state switching device has a parallel connected capacitor and a series inductor, with both inductors connected to the load circuit. In this embodiment resonances may be present that at the design frequency allow the voltage on the load circuit to be almost sinusoidal and the solid state switches to be switched on with almost zero voltage imposed upon them.

For a better understanding of the invention and to show how it may be carried into effect, embodiments thereof will now be described, by way of non-limiting example only, with reference to the accompanying drawings.

DETAILED DESCRIPTION OF THE INVENTION

Figure 1:
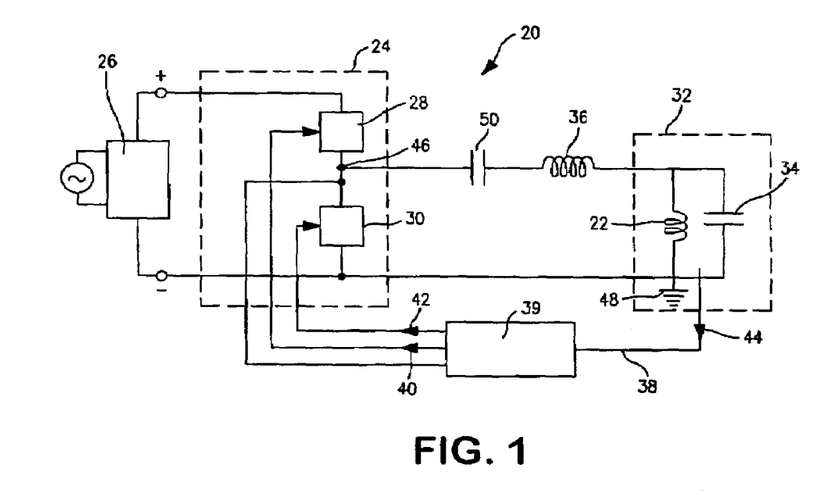
FIG. 1 is a block diagram of an RF power generator according to an embodiment of the invention.

With reference to FIG. 1, an RF power generator 20 according to an embodiment of the invention includes an induction coil 22 for exciting an inductively coupled plasma (ICP) for spectrometry. As is known, the induction coil 22 is typically coaxial with a plasma torch (not shown) through which a plasma forming gas, typically argon, is passed at a controlled flow rate. The generator 20 comprises a switching circuit 24 that is connectable across a DC voltage supply which is preferably an AC to DC converter as indicated at 26. The switching circuit 24 includes first and second solid state switching devices 28 and 30 in a half bridge configuration. The induction coil 22 is part of a load circuit 32 that also includes a capacitor 34 in parallel with the induction coil 22. The load circuit 32 is grounded at 48. RF power from the switching circuit 24 is coupled to the load circuit 32 by an inductor 36 and blocking capacitor 50. The impedances of load circuit 32 plus the inductor 36 are such as to be resonant at a first frequency. The generator 20 furthermore includes a feedback control circuit 38 including control circuitry 39 which receives a feedback signal, indicated by reference 44, from the load circuit 32 and provides signals, indicated by references 40, 42, for switching the solid state switching devices 28 and 30 respectively. Feedback signal 44 may be either a current or voltage signal or both.

When solid state switching device 28 turns on, the current in inductor 36 is initially flowing in the reverse direction, from right to left. After a short time the current reverses direction and power is transferred to the load 32 via inductor 36. DC blocking capacitor 50 accounts for the difference in average voltage on its two sides, half the DC supply on the left and zero on the right and plays no other role in the switching of the circuit 20. When the current from left to right in inductor 36 reaches a high level, solid state switching device 28 is turned off and the current continues to flow in the parasitic output capacitances of the two solid state switching devices 28 and 30, which are both off. This causes the voltage at a node 46 between devices 28 and 30 to fall, during the dead time, to a voltage close to ground. Solid state switching device 30 is now turned on, with low turn-on loss, and the current in it changes from flowing upwards to flowing downwards (with reference to the FIG. 1 depiction). When the current in inductor 36 flowing from right to left reaches a high level, solid state switching device 30 is turned off, the voltage at node 46 rises as the parasitic output capacitances of the two solid state switching devices 28 and 30 are charged up. This continues to the point where the voltage at node 46 is close to the DC supply voltage and solid state switching device 28 is turned on, with low loss and the cycle repeats. The current flow in coupling inductor 36 causes the voltage on the parallel load of induction coil 22 and capacitor 34 to vary according to their impedances, causing current flow in the induction coil 22, sustaining the plasma.

The feedback control circuit 38 critically controls the switching instants of the solid state switching devices 28 and 30 to ensure oscillation of current in the load circuit 32, and thus in induction coil 22, at a frequency higher than the first (resonant) frequency (for example about 1–6% higher) to ensure an inductive load on the solid state switching devices 28 and 30.

The solid state switching devices 28 and 30 typically are switchable on and off via gate terminals and thus the control circuitry 39 of the feedback control circuit 38 will include gate drive circuitry.

Figure 2:
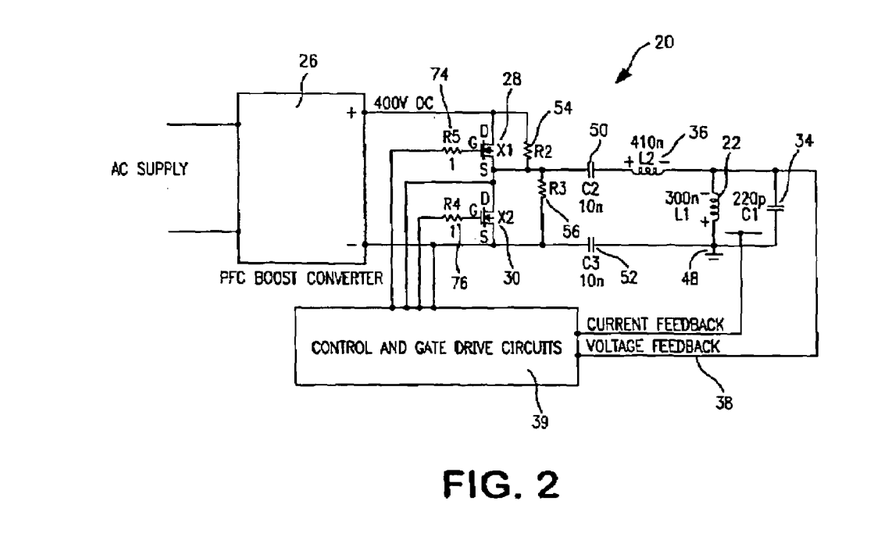
FIG. 2 is a more detailed block diagram of an embodiment of an RF power generator according to FIG. 1.

FIG. 2 illustrates a more detailed RF power generator 20 according to an embodiment of the invention. Components in FIG. 2 corresponding with those in FIG. 1 have been accorded the same reference numerals. In FIG. 2, the two solid state switching devices 28 and 30 are insulated gate field effect transistors, that is, MOSFETs, for example type DE375–501N21A (manufactured by IXYS RF of Fort Collins, Colo., USA).

The DC supply 26 is via a non-isolated power factor correcting (PFC) boost converter to convert an AC input to a fixed DC supply. The DC supply is chosen to be above the peak value of the AC input, approximately 400V for common 200–240 V AC supply voltages. This converter 26 is a relatively inexpensive AC to DC converter having a high power factor and regulated output voltage.

Blocking capacitors 50 and 52 are provided to couple the RF power output of the half-bridge switching circuit of MOSFETs 28 and 30 to the coupling inductor 36 and load circuit comprising induction coil 22 and capacitor 34. These capacitors 50 and 52 provide DC blocking for the DC supply and its superimposed rectified mains wave form. To charge the capacitor 50 to the appropriate DC voltage at power up, resistors 54 and 56 are connected across the drain (D) to source (S) terminals of each MOSFET 28 and 30. Thus resistors 54 and 56 provide for a DC charging current to flow from the positive of DC supply 26 to capacitor 50 which capacitor allows the RF currents to flow unimpeded.

Figure 3:
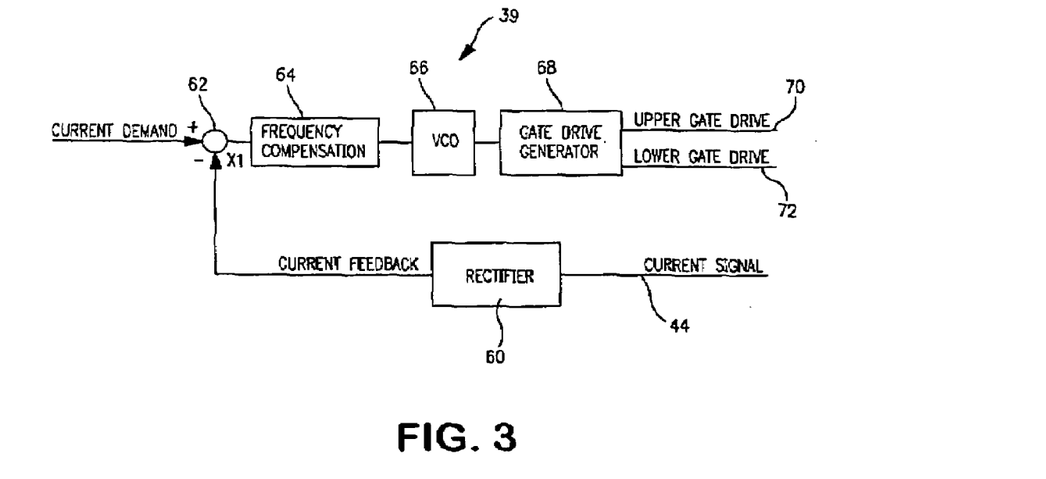
FIG. 3 is a block diagram illustrating a first embodiment of a feedback control circuit.

FIG. 3 shows an embodiment of control circuitry 39 of a feedback control circuit or loop 38 that includes gate drive circuitry. This includes a voltage controlled oscillator (VCO) 66 for driving the gates of MOSFETs 28 and 30 to switch them on and off. A current feedback signal 44 from the induction coil 22 branch of load circuit 32 is rectified by a rectifier 60 and the rectified signal applied to the current demand circuit of the gates of the MOSFETs 28 and 30 via a subtractor 62. The resultant signal is amplified then frequency compensated as indicated at 64 to drive the VCO 66 which gives a square wave output, which is modified by gate drive generator 68 circuitry for application to the gate terminals of the MOSFETs 28 and 30. In this embodiment a fixed dead time may be set in the gate drive generator 68 at the factory. The generator circuit 68 provides gate drive signals, respectively 70 and 72, for switching the MOSFETs 28 and 30 on and off. The VCO 66 frequency is made dependent on the current in the induction coil 22 (via current feedback 44) and the RF generator 20 circuit is operated above resonance. If the current in induction coil 22 is too high, the frequency is increased, if the current is too low, the frequency is decreased.

Referring to FIG. 2, power is coupled from the half bridge of MOSFETs 28 and 30 to the induction coil 22 by capacitor 50, inductor 36, capacitor 52 and capacitor 34. The combination of induction coil 22, inductor 36 and capacitor 34 is designed to be resonant at a first frequency and the circuit 20 is operated at a second frequency approximately 1–6% above the first (resonant) frequency. The optimum values for these components will depend on the inductance of the induction coil 22, the coupling to the plasma and the temperature and size of the plasma, and can be determined by simulation and experimentation. The components must be designed or selected to be capable of carrying the high RF currents in this part of the circuit of RF power generator 20. A small amount of parasitic inductance in capacitor 34 is of no concern.

The DC blocking capacitors 50 and 52 can be of any value in the range 2 nF upwards but must be able to carry the high RF current in this part of the circuit. Any parasitic inductance in the case of capacitor 50 will merely add to the inductance of inductor 36. The capacitor 52 is only required in embodiments where a non-isolated converter 26 is used.

Figure 5:
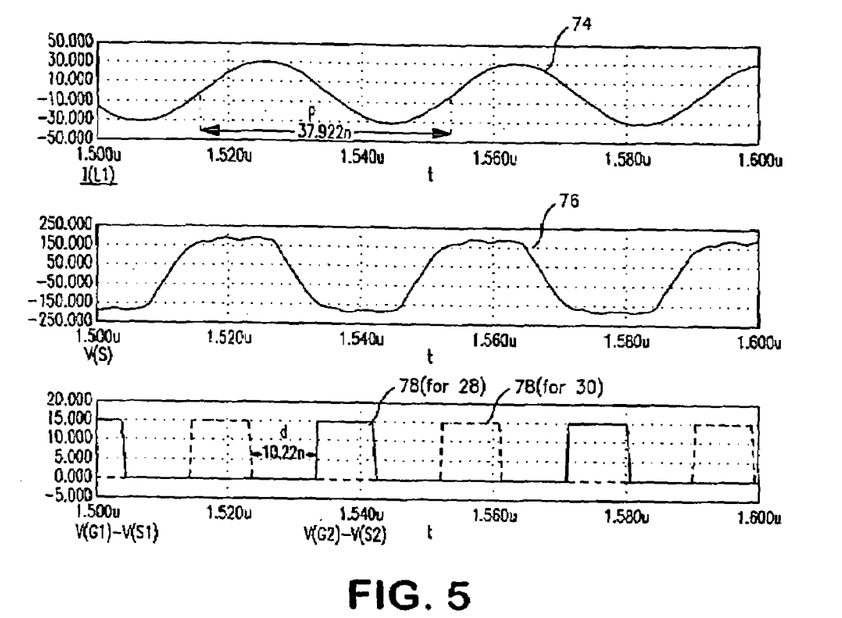
FIG. 5 is a graph of wave forms illustrating operation of an RF power generator embodiment according to FIGS. 2 and 3.

FIG. 5 shows wave forms of the induction coil 22 current (see trace 74), the half bridge switching circuit of MOSFETs 28 and 30 output voltage (see trace 76), and the gate drive voltage signals (see traces 78). On traces 78, each high shown in full switches ON the upper (positive side) MOS-FET 28 and each high shown dashed switches ON the lower (negative side) MOSFET 30, with the delay between each pulse (see "d" on traces 78) being the dead time between switching of the MOSFETs 28 and 30. The switching of the MOSFETs 28 and 30 as per traces 78 gives a voltage output as per trace 76 and the resonant characteristics of the combination of inductor 36 and load circuit 32 (that is, induction coil 22 and parallel capacitor 34) give an RF sinusoidal current in the induction coil 22 as per trace 74, having a period as indicated by "p" on trace 74.

FIG. 5 illustrates that with circuit values as indicated on FIG. 2, a dead time of about 10 ns gives an induction coil 22 current of about 30 A peak at a frequency of approximately 27 MHz.

With a feedback control circuitry 39 as illustrated in FIG. 3, for start-up, the VCO 66 can start driving the MOSFETs 28 and 30 at any time. The feedback control circuit 38 should be initialised with the VCO 66 at maximum frequency and the current demand set to a low value, about 10% of full current. From here the feedback control circuit 38 can take control. The current demand can then be slowly ramped up to the desired value over a period of approximately 50 µs.

The output current in induction coil 22 is controlled by varying the frequency of the drive to the MOSFETs 28 and 30. Referring to FIG. 3, the current feedback 44 is subtracted from the current demand 62 and the difference amplified. The frequency compensation 64 ensures that the feedback control loop 38 is stable and responds quickly to changes in the load impedance. The gate drive generator circuit 68 takes the VCO 66 output and generates the non-overlapping gate drive signals 70 and 72 for the upper and lower MOSFETs, respectively 28 and 30. If the output current is less than the demanded current, the VCO 66 frequency is reduced and the output current increases. The output current is monotonic with frequency over a large range, the only limits being due to increased loss at the extremes of frequency. The VCO 66 frequency limits should be carefully chosen to limit the losses in the switching MOSFETs 28 and 30 which increase at both the low and high frequency ends, particularly when no plasma is present. Regulating the current in the induction coil 22, rather than the power or some other quantity, makes control easy and does not require any change when the plasma is lit or when it extinguishes. At these times the plasma impedance changes over a large range but regulating the current ensures that a strong magnetic field is present for ignition and keeps the power substantially constant when the plasma is present. The frequency compensation 64 can be implemented in analog or digital technology.

Figure 4:
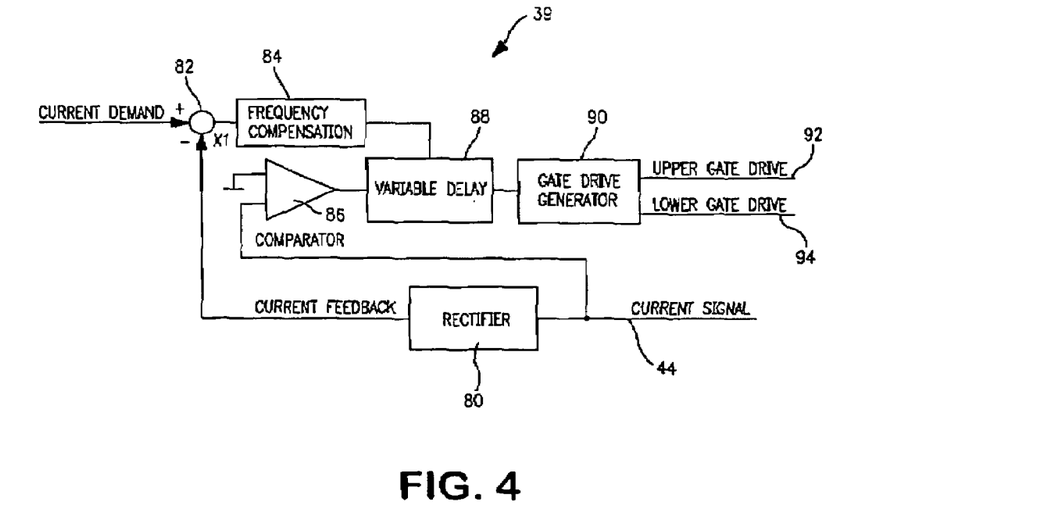
FIG. 4 is a block diagram illustrating a second embodiment of a feedback control circuit.

FIG. 4 shows a second embodiment of control and gate drive circuitry 39 for a feedback control circuit 38. This circuitry 39 controls the MOSFETS 28 and 30 by turning them ON a certain amount of time after the zero crossing of the current in the induction coil 22. This time is referred to as the delay time. As in the first embodiment, a dead time is allowed to avoid simultaneous conduction of the two MOSFETs. The current in the induction coil 22 is controlled by varying the delay time, a longer time giving greater current. The delay time is chosen so that the RF power generator 20 circuit switches at a frequency above the resonant frequency, the longer delay time causing the frequency to be closer to resonance, hence the greater output.

Thus, in the FIG. 4 circuit, the current feedback signal 44 from the induction coil 22 is rectified by a rectifier 80 and the rectified signal subtracted from the current demand signal via subtracter 82 and amplified, then frequency compensated as indicated at 84. The resultant signal is applied to a variable delay generator 88. The current feedback signal 44 is also fed through a zero referenced comparator 86 to generate a timing reference signal for the variable delay generator 88. The frequency compensation 84 ensures that the feedback control circuit or loop 38 is stable and responds quickly to changes in the load impedance. The output of the frequency compensation 84 controls the variable delay 88 that delays the timing reference signal from the comparator 86. The output of the variable delay 88 is input to a gate drive generator 90 that generates the gate drive signals 92 and 94 for the upper and lower MOSFETs, respectively 28 and 30. Increasing the delay increases the output current and vice versa.

With a feedback control circuitry 39 for the feed back control circuit 38 as in FIG. 4, operation of the RF power generator 20 has to be started. The feedback control loop 38 should be initialised with the delay at minimum and the current demand set to a low value, about 10% of full current. The operation must be started by turning ON MOSFET 28 for approximately 20 ns. After that, the feedback control circuit 38 can resume normal operation.

Figure 6:
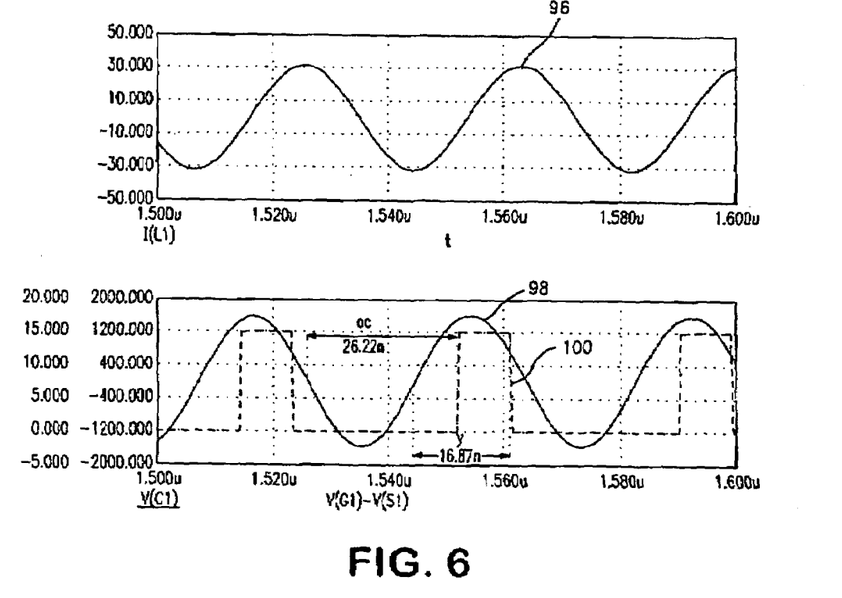
FIG. 6 is a graph of wave forms illustrating operation of an RF power generator embodiment according to FIGS. 2 and 4.

FIG. 6 shows wave forms for an RF power generator 20 as in FIG. 1 or 2 having a feedback control circuit 38 that includes control circuitry 39 as in FIG. 4. The wave forms are the induction coil 22 current (see trace 96), the voltage across capacitor 34 (see trace 98) and superimposed thereon the gate drive switching signal (92 of FIG. 4) for MOSFET 28 (see trace 100). The time delay (which includes the dead time between switching of the MOSFETs) between a zero crossing of voltage trace 98 and switching ON of MOSFET 28 is indicated by "x" and the time delay between the subsequent zero crossing of trace 98 and switching OFF of MOSFET 28 is indicated by "y".

The FIG. 6 traces are with a dead time "d" of about 10 ns and a time delay "y" of 16.9 ns giving a delay time plus dead time "x" of 26.22 ns.

Figure 7:
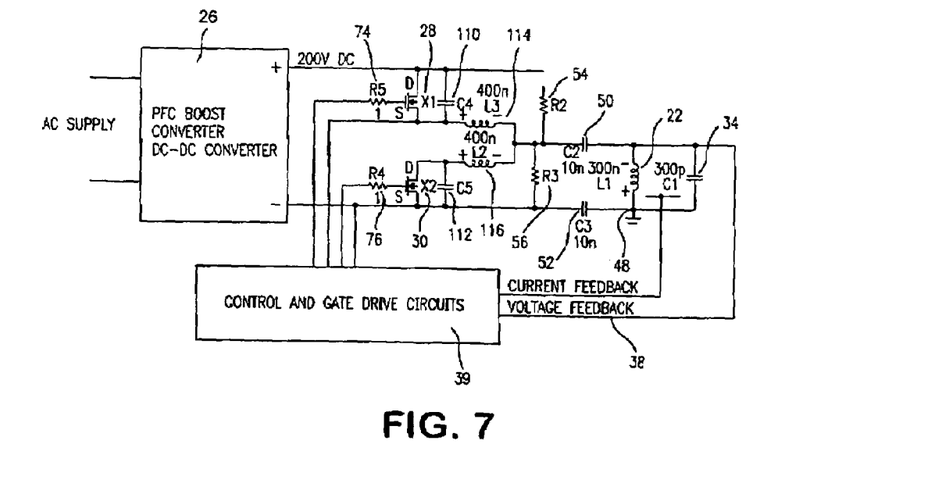
FIG. 7 is a block diagram of the preferred embodiment of an RF power generator according to the invention.

In FIG. 7, which illustrates the preferred embodiment of the invention, components corresponding with those in FIGS. 1 and 2 have been accorded the same reference numeral. In this embodiment, the two RF MOSFETS 28 and 30 may be type DE 375–501 N2IA (as for FIG. 2) or equivalent. In this embodiment each MOSFET switch 28 and 30 is allowed to zero-voltage switch with 50% duty cycle by connecting a capacitor, respectively 110, 112, in parallel with each of the switches 28 and 30, and an inductor, respectively 114, 116, in series with each of the switches 28 and 30. The inductors 114 and 116 are connected to the load circuit 32, that is, the parallel combination of the induction coil 22 and the capacitor 34, by the DC blocking capacitor 50. The incoming power supply from 26 must be bypassed to allow the RF currents to flow unimpeded. The tracks joining the bypass capacitors 110 and 112 to the drain terminal of MOSFET switch 28, the source terminal of MOSFET switch 28 to the drain terminal of MOSFET switch 30 and the source terminal of MOSFET switch 30 to the lower end of the bypass capacitor 112 must be designed for low impedance.

It is important that the coupling capacitors 50 and 52 be charged to the appropriate DC voltage at power-up. Resistors 54 and 56 provide the charging current.

Figure 8:
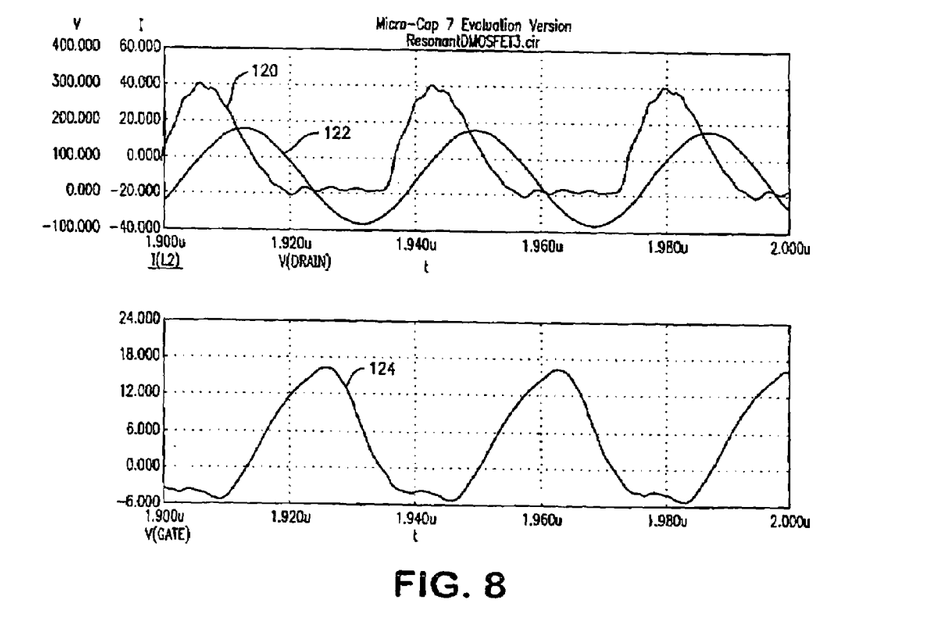
FIG. 8 is a graph of waveforms illustrating operation of the preferred embodiment of FIG. 7.

The voltages and currents for MOSFET 30 are shown in FIG. 8 in which trace 120 shows the voltage at the drain terminal of MOSFET 30, trace 122 is the current through inductor 116 and trace 124 the gate drive voltage for MOSFET 30. As can be seen from FIG. 8, the drain voltage 120 goes to zero before the MOSFET 30 switches on and starts to carry significant current from inductor 116. This is important to achieve high efficiency. The currents and voltages for MOSFET 28 are complementary to those for MOSFET 30.

A simple, low Q, resonant gate drive may be used because a 50% gate drive is all that is required. A single gate drive can drive both MOSFETs in a complementary manner. Due to the topology of the circuit, no consideration needs to be given to crossover conduction or dead time.

Referring to FIG. 7, power is coupled from the half-bridge 28-30 to the induction coil 22 by capacitor 50, inductor 116, inductor 114, capacitor 52 and capacitor 34. The combination of induction coil 22 and capacitor 34 is designed to be resonant at a frequency approximately 40% below the intended operating frequency that is, the second frequency. The optimum values for these components will depend on the inductance of the induction coil 22, the coupling to the plasma and the temperature and size of the plasma, so they will need to be determined by simulation and experimentation. The components must be designed to be capable of carrying the high RF currents in this part of the circuit. A small amount of parasitic inductance in capacitor 34 does not affect circuit operation.

The DC blocking capacitors 50 and 52 can be of any value in the range 2 nF upwards but must be able to carry the high RF current in this part of the circuit. Any parasitic inductance in the case of capacitor 50 will merely add to inductor 116. Capacitor 52 is only required in embodiments where a non-isolated AC to DC converter 26 is used.

The combinations of inductor 116/capacitor 112 and inductor 114/capacitor 110 are designed to be resonant about 45% below the intended operating frequency. Their exact values can be determined by simulation or experiment to maximise efficiency.

The output current is controlled by varying the frequency of the drive to the MOSFETs 28 and 30 for example as described above with reference to FIG. 3 or FIG. 4. Start up of the preferred embodiment is also as described above with either circuit.

It is envisaged that embodiments as above described will deliver a power level of about 1.6 kW at 27 MHz and an efficiency of greater than 70%. The preferred embodiment of FIG. 7, with currently available components, can be built to operate at up to about 27 MHz, but becomes less efficient as the operating frequency increases.

The DC power supply 26 for, or of, the RF power generator 20 may be an isolated instead of non-isolated AC to DC converter and the control strategies as in FIG. 3 or 4 used.

In another embodiment using an isolated AC to DC converter, the converter may be varied to control the DC supply voltage and hence the output current. It may use a fixed time delay from the zero crossing of the output current or voltage to control the switching time. This ensures that the circuit will oscillate at a frequency yielding efficient operation.

In other embodiments, circuits similar to the embodiments of FIGS. 2 to 4 and 7 may be used, except that a different output variable or combination of variables may be regulated by the feedback control 39. This could be output power, current, voltage or some combination of these that changes based on the prevailing plasma conditions or some other variable, for example time.

Electromagnetic compatibility (EMC) of the RF power generator 20 circuit is a factor in the design of the generator. First, an RF power generator 20 as described herein is a free running oscillator and potentially the output frequency can vary outside the specified Industrial Scientific and Medical (ISM) frequency band. Thus the emissions from the circuit must be effectively shielded. Second, embodiments as in FIGS. 2 to 4 and 7 will require special design for a non-isolated power factor correcting AC to DC converter 26 to be used. Specifically, the RF current in the load circuit 32 also flows in the capacitor 52 and, since the load is grounded at 48, the switching circuit 24 side of the capacitor 52 has an RF voltage imposed upon it. This part of the circuit must be AC grounded for overall noise management and so an extra component can be inserted to allow these requirements to be simultaneously satisfied. A common mode choke allows the passage of large differential currents but presents a high impedance to common mode voltages. Thus, by inserting a common mode choke between the load circuit 32 and the load coupling components 36 and 50, 52 both the load side and the supply side may be AC grounded and the RF current constrained to flow predominantly not in the ground connections. The common mode choke can be constructed using transmission line transformer technology. The capacitance from input to output must be low to minimise the RF noise current flow in the ground connections. Inductance in series with capacitor 52 adds to the RF voltage impressed upon the common mode choke and thus must be minimised for lowest noise.

Compared with known solid state generators, the present RF power generator 20 has a higher supply voltage, making parasitic inductances less of a problem, and has good control of over-voltage by the clamping inherent in the half bridge configuration of MOSFETs 28 and 30. It has advantages over prior generators using only one switching component in that two components are used and the heat loss is naturally distributed between them, making the task of cooling simpler. By designing the load seen by the half bridge switching circuit 24 to be such that the MOSFET output capacitance is substantially discharged before the MOSFET is turned on, the efficiency of the circuit can be made very high.

The invention described herein is susceptible to variations, modifications and/or additions other than those specifically described and it is to be understood that the invention includes all such variations, modifications and/or additions which fall within the scope of the following claims.

What is claimed is:

1. A radio frequency(RF) power generator for an induction coil for exciting an inductively coupled plasma for spectrometry, the RF power generator comprising:
   a switching circuit connectable across a DC supply voltage, the switching circuit comprising a first and a second solid state switching devices alternately switchable on and off for supplying RF power;
   a load circuit comprising the induction coil and a capacitor connected in parallel with the induction coil;
   an inductor connected between the switching circuit and the load circuit for coupling the RF power to the load circuit, wherein the inductor and load circuit forming an arrangement, which is resonant at a first frequency; and
   a feedback control circuit from the load circuit to the switching circuit for switching the solid state switching devices on and off for driving an oscillation in the load circuit at a second frequency that is higher than the first frequency.

2. The radio frequency power generator as claimed in claim 1, wherein the first and second solid state switching devices are insulated gate field effect transistors (MOSFETs).

3. The radio frequency power generator as claimed in claim 2, wherein the feedback control circuit is operable to vary switching instants of the MOSFETs via gate drive terminals of the MOSFETs.

4. The radio frequency power generator as claimed in claim 3, wherein the feedback control circuit comprises a rectifier for rectifying a load current signal from the induction coil, a subtractor for applying the rectified load current signal to a current demand circuit of the gates of the MOSFETs, and a frequency compensated voltage controlled oscillator for driving a gate drive generator circuit for generating respective time separated signals for driving the gate terminals of the respective MOSFETs.

5. The radio frequency power generator as claimed in claim 3, wherein the feedback control circuit comprises a rectifier for rectifying a load current signal from the induction coil, a subtractor for applying the rectified load current signal to a current demand circuit of the gates of the MOSFETs, and then a variable delay modulator for driving a gate drive generator circuit for generating respective time separated signals for driving the gate terminals of the respective MOSFETs, and comprising a zero referenced comparator, which receives the load current signal to generate a timing reference signal for the variable delay modulator.

6. The radio frequency power generator as claimed in claim 2, comprising a capacitor connected in parallel across a drain and a source terminals of each respective MOSFET and an inductor connected in series with each respective MOSFET, wherein the inductors are connected together to the load circuit for coupling the RF power to the load circuit.

7. The radio frequency power generator as claimed in claim 6, wherein the MOSFETs, parallel connected capacitors and series connected inductors are arranged for each MOSFET to switch at a substantially zero voltage with a substantially 50% duty cycle.

8. The radio frequency power generator as claimed in claim 7, wherein the feedback control circuit is operable to vary switching instants of the MOSFETs via gate drive terminals of the MOSFETs.

9. The radio frequency power generator as claimed in claim 8, wherein the feedback control circuit comprises a rectifier for rectifying a load current signal from the induction coil, a subtractor for applying the rectified load current signal to a current demand circuit of the gates of the MOSFETs, and a frequency compensated voltage controlled oscillator for driving a gate drive generator circuit for generating respective time separated signals for driving the gate terminals of the respective MOSFETs.

10. The radio frequency power generator as claimed in claim 8, wherein the feedback control circuit comprises a rectifier for rectifying a load current signal from the induction coil, a subtractor for applying the rectified load current signal to a current demand circuit of the gates of the MOSFETs, and a variable delay modulator for driving a gate drive generator circuit for generating respective time separated signals for driving the gate terminals of the respective MOSFETs, and comprising a zero referenced comparator which also receives the load current signal to generate a timing reference signal for the variable delay modulator.

11. The radio frequency power generator as claimed in claim 1, further comprising an AC to DC converter across which the switching circuit is connected.

12. The radio frequency power generator as claimed in claim 11, wherein the feedback control circuit comprises a connection to the AC to DC converter for varying the DC supply voltage.

13. A radio frequency (RF) power generator for an induction coil for exciting an inductively coupled plasma for spectrometry, the RF power generator comprising:
- a source for providing a DC supply voltage;
- a switching circuit connected across the DC supply voltage and comprising a first and a second solid state switching devices alternately switchable on and off for supplying RF power;
- a load circuit comprising the induction coil and a capacitor connected in parallel with the induction coil;
- an inductor connected between the switching circuit and the load circuit for coupling the RF power to the load circuit, wherein the inductor and load circuit forming an arrangement, which is resonant at a first frequency;
- a control circuit connected to the switching circuit for switching the solid state switching devices on and off for driving an oscillation in the load circuit at a second frequency that is higher than the first frequency; and
- a feedback control circuit from the load circuit to the source for varying the DC supply voltage for varying the RF power to the load circuit.

14. The radio frequency power generator as claimed in claim 13, wherein the first and second solid state switching devices are insulated gate field effect transistors (MOSFETs).

15. The radio frequency power generator as claimed in claim 14, comprising a capacitor connected in parallel across a drain and a source terminals of each respective MOSFET and an inductor connected in series with each respective MOSFET, wherein the inductors are connected together to the load circuit for coupling the RF power to the load circuit.

* * * * *